(12) United States Patent
Oishi et al.

(10) Patent No.: US 7,253,447 B2
(45) Date of Patent: Aug. 7, 2007

(54) LIGHT EMITTING ELEMENT AND LIGHT EMITTING DEVICE WITH THE LIGHT EMITTING ELEMENT AND METHOD FOR MANUFACTURING THE LIGHT EMITTING ELEMENT

(75) Inventors: Nodoka Oishi, Yamanashi-ken (JP); Koichi Fukasawa, Yamanashi-ken (JP); Sadato Imai, Yamanashi-ken (JP)

(73) Assignee: Citizen Electronics Co., Ltd., Yamanashi-ken (JP)

( * ) Notice: Subject to any disclaimer, the term of this patent is extended or adjusted under 35 U.S.C. 154(b) by 0 days.

(21) Appl. No.: 10/784,242

(22) Filed: Feb. 24, 2004

(65) Prior Publication Data
US 2004/0169451 A1    Sep. 2, 2004

(30) Foreign Application Priority Data
Feb. 28, 2003    (JP) .............................. 2003-052776

(51) Int. Cl.
*H01L 33/00* (2006.01)
(52) U.S. Cl. ................. 257/99; 257/100; 257/E33.058; 257/E33.066; 257/E33.057; 257/E33.075
(58) Field of Classification Search ................ 257/100, 257/99, E33.075, 98, E33.056–E33.058, 257/E33.059, E33.065, 79, E33.066, 706, 257/707; 362/294, 310; 372/36; 313/498, 313/512
See application file for complete search history.

(56) References Cited

U.S. PATENT DOCUMENTS

| 5,857,767 | A | 1/1999 | Hochstein | |
|---|---|---|---|---|
| 6,498,355 | B1* | 12/2002 | Harrah et al. | 257/99 |
| 6,501,103 | B1* | 12/2002 | Jory et al. | 257/100 |
| 2004/0065894 | A1* | 4/2004 | Hashimoto et al. | 257/100 |
| 2005/0073846 | A1* | 4/2005 | Takine | 362/296 |

FOREIGN PATENT DOCUMENTS

| DE | 4336961 | 5/1995 |
|---|---|---|
| DE | 20219869 | 5/2003 |
| DE | 10260432 | 7/2004 |
| EP | 1139439 | 10/2001 |
| JP | 11298048 A | * 10/1999 |
| WO | 02097884 | 12/2002 |
| WO | 03019679 | 3/2003 |
| WO | 03030274 | 4/2003 |

OTHER PUBLICATIONS

English Translation of JP 11-298048A.*

* cited by examiner

*Primary Examiner*—Matthew C. Landau
(74) *Attorney, Agent, or Firm*—Dennison, Schultz & MacDonald

(57) ABSTRACT

A light emitting diode has a base made of heat conductive material, a wire plate made of an insulation material and secured to an upper surface of the base. Conductive patterns are secured to the wire plate, and a light emitting diode element is secured to the base at an exposed mounting area. The light emitting diode element is electrically connected to the conductive patterns.

8 Claims, 9 Drawing Sheets

LIGHT EMITTING ELEMENT AND LIGHT EMITTING DEVICE WITH THE LIGHT EMITTING ELEMENT AND METHOD FOR MANUFACTURING THE LIGHT EMITTING ELEMENT

BACKGROUND OF THE INVENTION

The present invention relates to a high luminance light emitting diode (LED) including an LED element, and to a method for manufacturing the LED, and more particularly to the LED which is improved in heat radiation thereof. The LED element of compound semiconductor is widely used because of long life and small size. Further, the LED element of GaN semiconductor which emits blue light has been produced, and the LED including this kind of LED element is used in color display devices also in a small color backlight system of the portable telephone and in an automotive display, and the utilization field of the LED is further expanded as an illumination device having a high luminance and high power.

In recent years, various LEDs of the surface mount type are produced because of mass productivity and miniaturization of the LEDs. However, when those kind of LEDs are operated at high luminance and high power, there is a problem of heat radiation. Namely, if the driving current is increased in order to increase the luminance, the loss of electric power increases in proportion to the increase of driving current, and most of electric energy is transformed into heat, thereby increasing the heat of the LED to high temperature. The light emitting efficiency (current-light transformation efficiency) of the LED decreases as the temperature of the LED is elevated. Further, the life of the LED element becomes short, and the transparency of the resin covering the LED element decreases because of color change thereof at high temperature, which causes the reliability of the LED to reduce.

In order to resolve these problems, various heat radiation means have been proposed. As one of the means, an LED is proposed, wherein a pair of conductive members made of heat conductive metal are secured to an insulation member, and an LED element is mounted on the conductive members. Japanese Patent Application Laid Open 11-307820 discloses this kind of LED.

FIG. 16 is a perspective view showing the conventional LED.

The LED 1 comprises a pair of conductive members 2a and 2b made of metal having high thermal conductivity, an insulation member 3 made of resin for insulating the conductive members 2a and 2b and combining the members. The insulation member 3 has an opening 3a having an elongated circular shape. A part of each of the conductive members 2a, 2b is exposed in the opening. An LED element 4 is secured to exposed parts of the conductive members 2a, 2b, so that the LED element 4 is electrically and thermally connected to conductive members 2a and 2b. The LED element 4 is encapsulated by a transparent sealing member 5.

The LED 1 is mounted on a print substrate 6, and the conductive members 2a and 2b are connected to a pair of conductive patterns 6a and 6b by solders.

When driving current is applied to the LED element 4 from the patterns 6a and 6b through conductive members 2a and 2b, the LED element 4 emits light. Heat generated in the LED element 4 by power loss is transmitted to the print substrate 6 through the conductive members 2a and 2b, so that the heat is efficiently radiated from the print substrate 6 if the substrate is made of a material having high thermal conductivity.

Another conventional heat radiation means is disclosed in Japanese Patent Application Laid Open 2002-252373. In the means, a base for mounting an LED element and lead frames as terminal electrodes are made of same material, the base and the lead frames are positioned at the same level, and the base is directly mounted on a substrate.

FIG. 17 is a sectional view showing the conventional LED. The LED 10 comprises a base 11 and a pair of lead frames 12a and 12b which are made of same conductive material and securely mounted on a print substrate 16 by solders 17, so that the base 11 and lead frames 12a, 12b are positioned at the same level, and are thermally combined with each other. An LED element 13 is mounted on the bottom of the base 11, thereby to be thermally combined with the base 11.

The anode and cathode of the LED element 13 are electrically connected to the lead frames 12a, 12b by lead wires 14a and 14b. A transparent resin 15 encapsulates the LED element 13, lead frames 12a, 12b and wires 14a, 14b. When driving current is applied to the LED element 13 from the print substrate 16 through lead frames 12a and 12b, the LED element 13 emits light. Heat generated in the LED element 13 by power loss is transmitted to the print substrate 16 through the base 11, so that the heat is efficiently radiated from the print substrate 16 if the substrate is made of a material having high thermal conductivity.

As another means, there is proposed that through holes are formed in the print substrate 16 by conductive patterns, and heat radiation members are disposed on the underside of the print substrate, so that heat is transmitted to the heat radiation members.

In the LED shown in FIG. 16, if the print substrate 6 is made of a material having high thermal conductivity such as a metal core substrate, heat radiation effect is expectable.

However, the print substrate 6 is generally made of cheap material such as an epoxy resin having low thermal conductivity. Namely, the thermal conductivity of the epoxy resin is one several hundredth of copper alloy as the material of the metal core substrate. Therefore, the heat is not sufficiently transmitted to the print substrate, thereby raising the temperature of the LED element, and reducing the quality thereof.

However, metal core can not be used because of high manufacturing cost. Furthermore, there is a problem that since it is difficult to wire on both sides of metal core substrate, high density mounting is impossible. In addition, it is necessary to insulate the surface of the metal core substrate by providing an insulation layer on the substrate since the metal core is conductive material. However, the insulation layer reduces the thermal conductivity to decrease the heat radiation effect.

The LED 10 of FIG. 17 also has the same problems as the LED of FIG. 16. Since the base 11 is directly adhered to the print substrate 16, the thermal conductivity from the base to the print substrate 16 must be effective. However, if the print substrate 16 is made of epoxy resin, heat radiation effect can not be expected. Further, if the conductive through holes are provided between the base 11 and the heat radiation members secured to the underside of the print substrate 16, heat connection there-between is not so effective, and hence great heat radiation improvement can not be achieved.

SUMMARY OF THE INVENTION

An object of the present invention is to provide an LED having an excellent heat radiation characteristic.

Another object is to provide a high luminance LED using a print substrate for mounting the high luminance LED element, the print substrate of which is not limited in material.

According to the present invention, there is provided an LED comprising a base made of heat conductive material and having a heat radiation surface formed on a surface thereof, at least one wire plate made of an insulation material and secured to an upper surface of the base, exposing means for forming an exposed mounting area on the surface of the base, conductive patterns formed on the wire plate, an LED element secured to the base at the mounting area, and connecting means for electrically connecting the LED element to the conductive patterns.

The exposing means is a perforated hole formed in the wire plate, and the connecting means comprises a plurality of lead wires.

An encapsulating member is provided for protecting the LED element.

Cooling fins are provided on the heat radiation surface of the base for increasing heat radiation effect. An LED is further provided.

The LED comprises a base made of heat conductive material and having a flat plate shape and a heat radiation surface formed on a surface thereof, at least one wire plate made of an insulation material and secured to an upper surface of the base, exposing means for forming an exposed mounting area on the surface of the base, conductive patterns secured to the wire plate, an LED element secured to the base at the mounting area, connecting means for electrically connecting the LED element to the conductive patterns, a print substrate having conductive patterns provided on an underside thereof and secured to the conductive patterns on the wire plate so as to electrically connect both the conductive patterns.

The print substrate has a hole for discharging the light emitted from the LED element, and a heat radiating member is secured to an underside of the base.

Another LED comprises a base made of heat conductive material and having a flat plate shape and a heat radiation surface formed on a surface thereof, at least one wire plate made of an insulation material and secured to an upper surface of the base, exposing means for forming an exposed mounting area on the surface of the base, conductive patterns secured to the wire plate, an LED element secured to the base at the mounting area, connecting means for electrically connecting the LED element to the conductive patterns, heat pipes projected from a side wall of the base, and a heat radiation member secured to ends of the heat pipes.

Another LED has a plurality of LED elements, each of the LED elements comprising a base made of heat conductive material and having a flat plate shape and a heat radiation surface formed on a surface thereof, at least one wire plate made of an insulation material and secured to an upper surface of the base, exposing means for forming an exposed mounting area on the surface of the base, conductive patterns secured to the wire plate, an LED element secured to the base at the mounting area, connecting means for electrically connecting the LED element to the conductive patterns, wherein the LED has a heat radiation member made of a flexible material, and the LED elements are supported on a surface of the heat radiation member.

The present invention further provides a method for manufacturing LEDs comprising the steps of preparing a wire plate aggregation having a plurality of divisions, and preparing a base aggregation having a same size as the wire plate aggregation, forming a mounting hole in each division of the wire plate aggregation, and providing a plurality of conductive patterns on each division, securing the wire plate aggregation and the base aggregation with each other, mounting an LED element on the wire plate aggregation at the mounting hole, electrically connecting the LED element with the conductive patterns by wires, encapsulating the LED element and wires by encapsulating member, and dicing the aggregation of the LEDs.

These and other objects and features of the present invention will become more apparent from the following detailed description with reference to the accompanying drawings.

DETAILED DESCRIPTION OF THE PREFERRED EMBODIMENT

Figure 1:
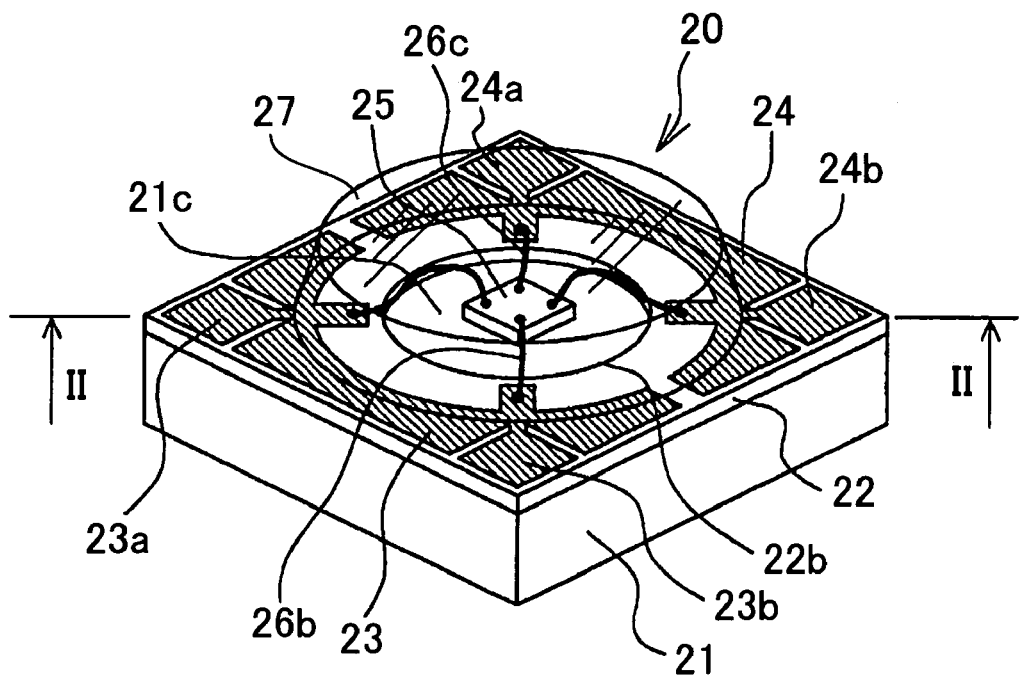
FIG. 1 is a perspective view of a high luminance LED according to a first embodiment of the present invention.
Figure 2:
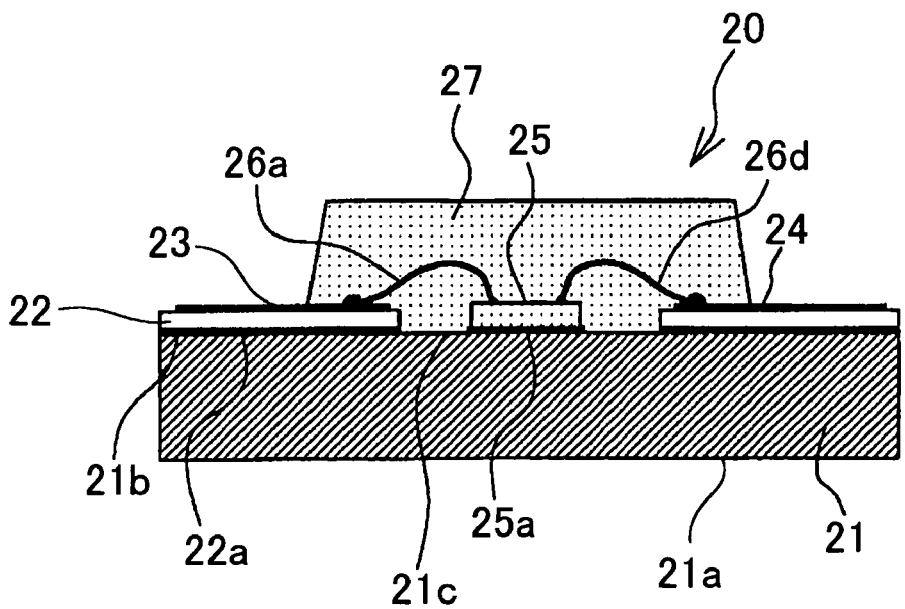
FIG. 2 is a sectional view taken along a line II—II of FIG. 1.

FIG. 1 is a perspective view of a high luminance LED according to a first embodiment of the present invention, FIG. 2 is a sectional view taken along a line II—II of FIG. 1.

The high luminance LED 20 comprises a base 21 having a rectangular parallelepiped and made of a metal core material of copper alloy having high thermal conductivity, and a wire plate 22 secured to the upper surface of the base by adhesives 22a opposite an underside heat radiation surface 21a. The wire plate is prepreg and has an insulation quality.

A pair of conductive patterns 23 and 24 are formed on the wire plate 22 by copper foil. The conductive patterns 23 and 24 have terminal portions 23a, 23b, 24a and 24b at respective corners as connecting surfaces. The terminal portions 23a, 23b, 24a and 24b are disposed opposite the heat radiation surface 21a of the base 21, interposing the wire plate 22 and the base 21.

A mounting opening 22b having a circular shape is formed in the wire plate 22 to expose a mounting area 21c of the upper surface of the base 21. An LED element 25 is mounted on the mounting area 21c and secured to the area by a silver paste 25a having thermal conductivity. Thus, the LED element 25 is thermally connected to the base 21 through the silver paste 25a.

A pair of anodes and a pair of cathodes (not shown) are electrically connected to the conductive patterns 23, 24 by four lead wires 26a, 26b, 26c and 26d. In order to realize a high luminance LED, a large driving current is necessary. To this end, it is preferable to apply a high current to the anodes and cathodes of the LED element by two wires respectively. The LED element 25, lead wires 26a 26d and a part of the wire plate 22 are encapsulated by an encapsulating member 27 to protect these members.

When driving voltage is applied to the conductive patterns 23 and 24, the voltage is applied to the LED element 25 through the wires 26a 26d. Thus, the LED element 25 is driven to consume the power to generate energy. A part of the energy becomes light which is discharged passing through the encapsulating member 27, and a large part of the energy becomes heat which is discharged from the LED element. The heat of the LED element is transmitted to the base 21 having excellent thermal conductivity through the silver paste 25a. Thus, the heat is efficiently transmitted to the base 21.

If a heat radiation member having a large heat capacity is adhered to the heat radiation surface 21a of the underside of the base 21, the heat of the base 21 is transferred to the heat radiation member, thereby realizing efficient heat radiation.

In this embodiment, although one LED element is provided, the base 21 is made into an elongated plate, a plurality of LED elements may be mounted on the base. Furthermore, a plurality of wire plates 22 may be secured to the upper surface of the base 21 so as to form the mounting area 21c.

Figure 3:
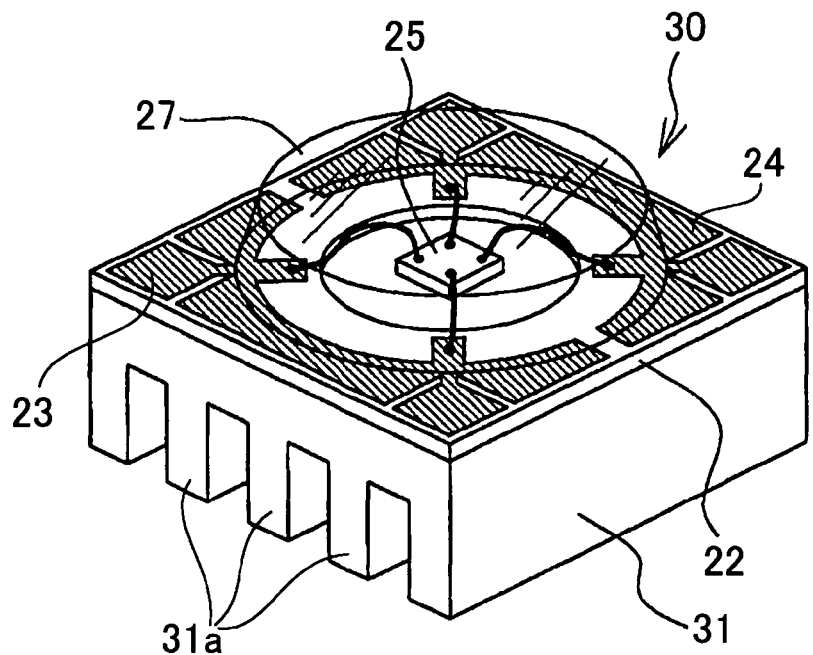
FIG. 3 is a perspective view of a high luminance LED according to a second embodiment of the present invention.

FIG. 3 is a perspective view of a high luminance LED according to a second embodiment of the present invention.

The same parts as the first embodiment are identified by the same reference numerals as those of FIGS. 1 and 2.

The high luminance LED element 30 has a base 31 having a rectangular parallelepiped and made of a metal core material of copper alloy having high thermal conductivity. A wire plate 22 is secured to the upper surface of the base 31 by adhesives. Since the wire plate 22, LED element 25 and encapsulating member 27 are the same as the first embodiment, explanation thereof is omitted hereinafter.

There is formed a plurality of parallel cooling fins 31a on the underside of the base 31 to increase the heat radiation area.

When the driving voltage is applied to the LED element 25, the LED element 25 is driven to consume the power to generate energy. A part of the energy becomes light which is discharged passing through the member 27, and a large part of the energy becomes heat which is discharged from the LED element. The heat of the LED element is effectively transmitted to the base 31. Since there is provided a plurality of cooling fins 31a on the underside of the base 31, the heat is effectively radiated to cool the LED element 25. If there is provided a cooling fan to cool the LED element 25, the heat radiation is more effectively performed. The cooling fins may be formed on side walls of the base 31.

Figure 4:
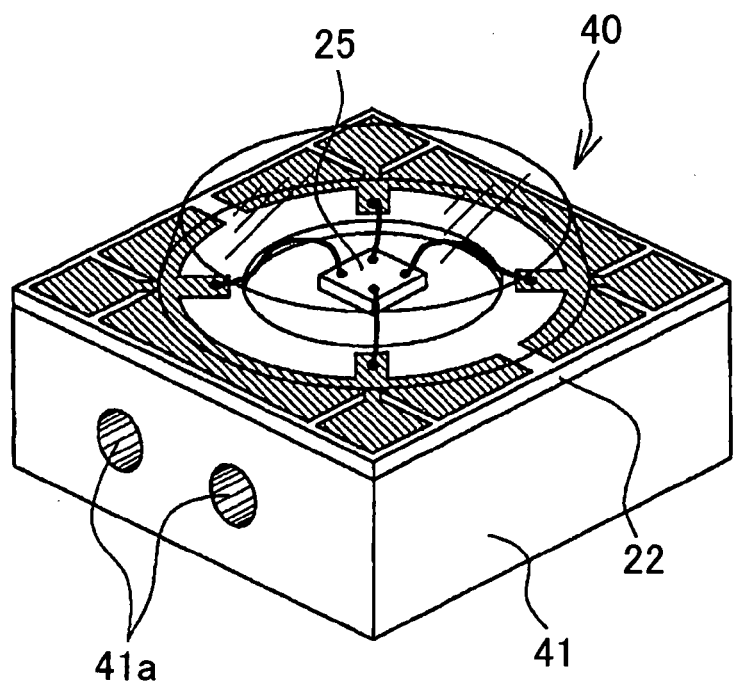
FIG. 4 is a perspective view of a high luminance LED according to a third embodiment of the present invention.

FIG. 4 is a perspective view of a high luminance LED according to a third embodiment of the present invention.

The same parts as the first embodiment are identified by the same reference numerals as those of FIGS. 1 and 2, and explanation thereof is omitted.

The high luminance LED 40 has a base 41 having a rectangular parallelepiped and made of a metal core material of copper alloy having high thermal conductivity.

There is formed a plurality of heat radiation cylindrical holes 41a in one of sides of the base 41 in parallel with the underside of the base. It is preferable that the hole 41a is perforated. If a heat conductive material is inserted in the hole, the heat radiation effect increases.

Figure 5:
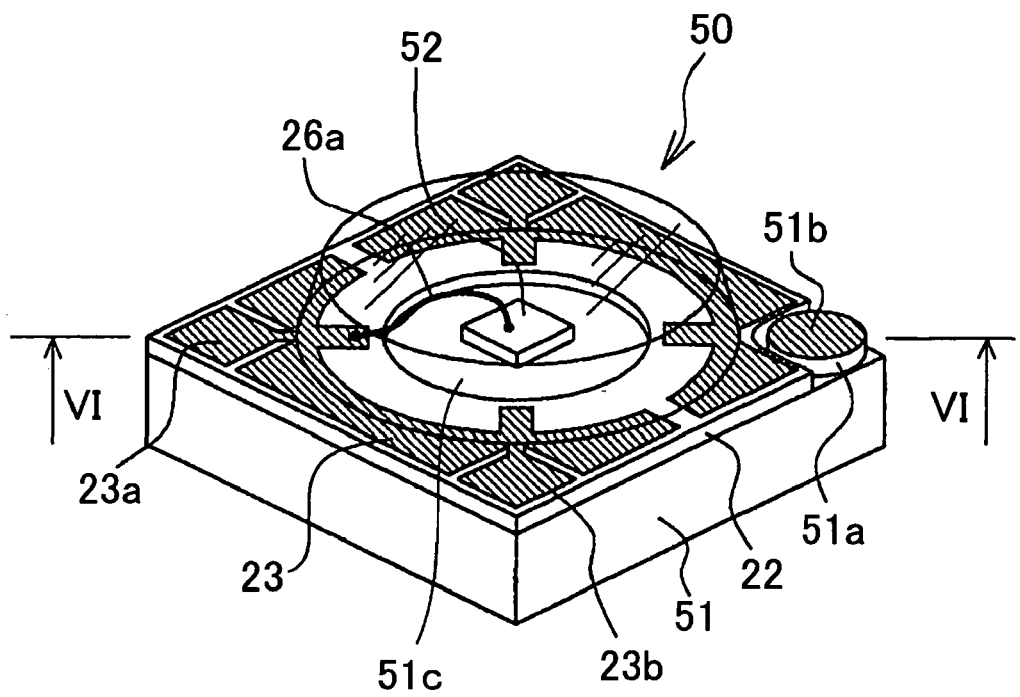
FIG. 5 is a perspective view of a high luminance LED according to a fourth embodiment of the present invention.
Figure 6:
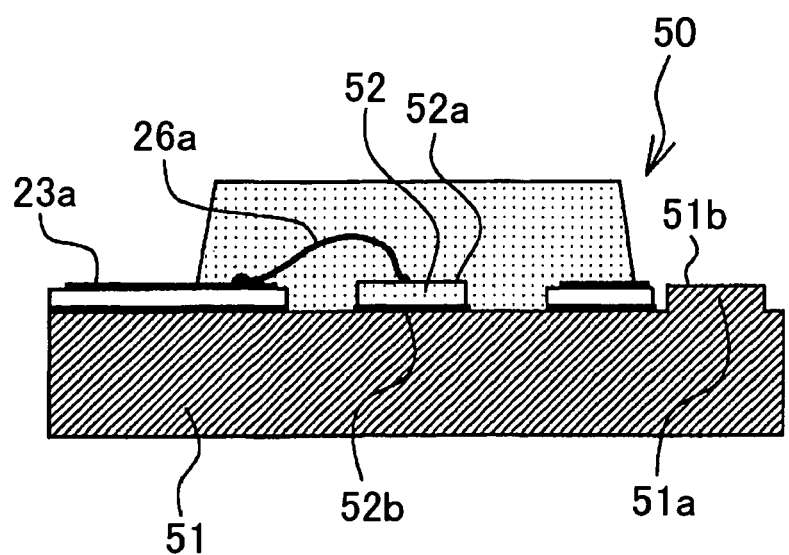
FIG. 6 is a sectional view taken along a line VI VI of FIG. 5.

FIG. 5 is a perspective view of a high luminance LED according to a fourth embodiment of the present invention, and FIG. 6 is a sectional view taken along a line VI VI of FIG. 5.

The same parts as the first embodiment are identified by the same reference numerals as those of FIGS. 1 and 2, and explanation about a part thereof is omitted.

The high luminance LED 50 has a base 51 having a rectangular parallelepiped and made of a metal core material of copper alloy having high thermal conductivity.

There is formed a cylindrical projection 51a on the base 51 at a corner. On the projection, a terminal portion 51b is provided as a terminal electrode. The wire plate 22 is recessed for the projection 51a. The height of the terminal portion 51b is equal to that of the terminal portion 23a, 23b.

An LED element 52 has an anode 52a on the upper surface thereof and a cathode 52b on the underside. The anode 52a is connected to the terminal portion 23a by the wire 26a and the cathode 52b is electrically connected to the terminal portion 51b of the projection 51a through the base 51.

When the driving voltage is applied to the LED element 52 from terminal portions 23a and 51b, the LED element 52 is driven to consume the power to generate energy. A part of the energy becomes light, and a large part of the energy becomes heat which is discharged from the LED element. The heat of the LED element is effectively transmitted to the base 51 to cool the LED element 52.

In accordance with the fourth embodiment, the base 51 is used as a lead member. Therefore, the LED element having electrodes on the upper surface and underside can be used.

Figure 7:
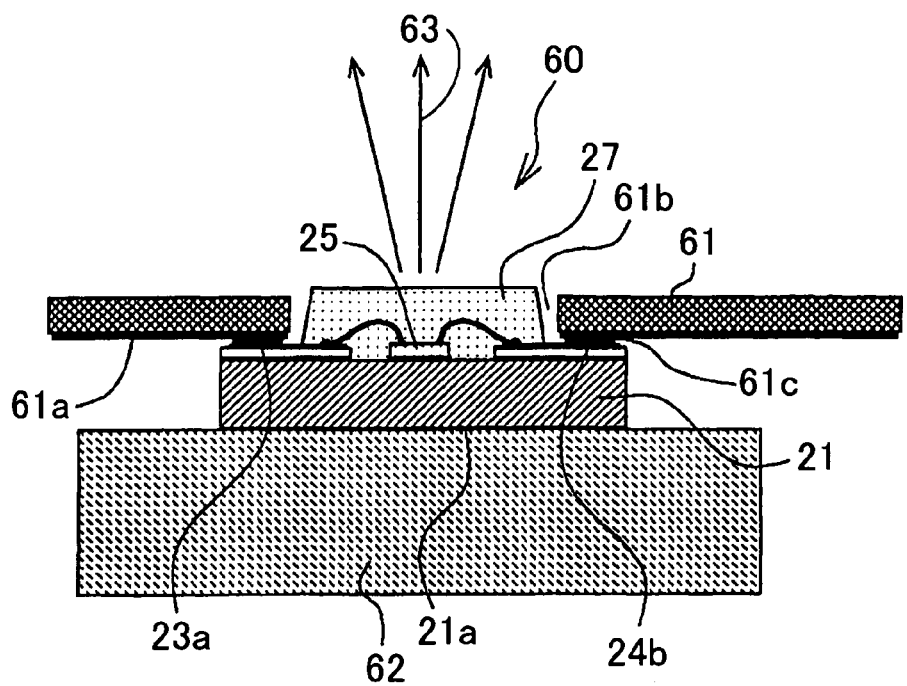
FIG. 7 is a sectional view of an LED according to a fifth embodiment of the present invention.

FIG. 7 is a sectional view of an LED according to a fifth embodiment of the present invention.

The same parts as the first embodiment are identified by the same reference numerals as those of FIGS. 1 and 2.

The LED device 60 comprises the high luminance LED element 25 of the first embodiment, a print substrate 61 as a substrate, and a heat radiation member 62 having thermal conductivity.

The print substrate 61 has conductive patterns 61a of copper foil on the underside thereof and a perforated hole 61b having a circular shape. The encapsulating member 27 is projected from the hole 61b and discharges the light emitted from the LED element 25 as discharge light 63. The conductive patterns 61a are electrically and mechanically connected to the terminal portions 23a, 23b, 24a and 24b with solders 61c. The heat radiation member 62 is secured to the heat radiation surface 21a of the base 21 to be thermally connected thereto.

When the driving voltage is applied to the terminal portions 23a, 23b, 24a and 24b through the conductive patterns 61a to supply driving current to the LED element 25, the LED element 25 is driven to emit light. The light is discharged as the discharge light 63 passing through the encapsulating member 27. Heat discharged from the LED element is effectively transmitted to the base 21 and to the heat radiation member 62.

In accordance with the fifth embodiment, the heat discharged from the LED element 25 is effectively transmitted to the heat radiation member 62 through the base 21 to radiate the heat to the atmosphere. Thus, the heat rise in the LED element is held to a minimum limit. Consequently, it is possible to provide an LED withstanding large current driving to emit high luminance light. Further, by virtue of the heat radiation effect, the deterioration of junctions in the LED element and luminance decrease caused by color change of the encapsulating member 27 due to high heat can be prevented, thereby realizing an LED having a high reliability and a long life.

The print substrate 61 connected to the terminal portions 23a, 23b, 24a and 24b is disposed apart from the heat radiation surface 21a of the base 21. Consequently, the print substrate 61 is not necessary to have heat radiation role, and hence it is not necessary to make the substrate with expensive material having high thermal conductivity such as metal core. Thus, it is possible to freely select a cheap material such as glass epoxy resin.

In order to increase the heat radiation effect of the heat radiation member 62, it is preferable to increase area of the member or to form a plurality of projections on surfaces of the member. Although the LED 20 of the first embodiment is used in the fifth embodiment, another LED of any embodiment may be used. In the case using the second embodiment, since the base 31 has a high heat radiation effect, the heat radiation member 62 is not necessary to be used.

Figure 8:
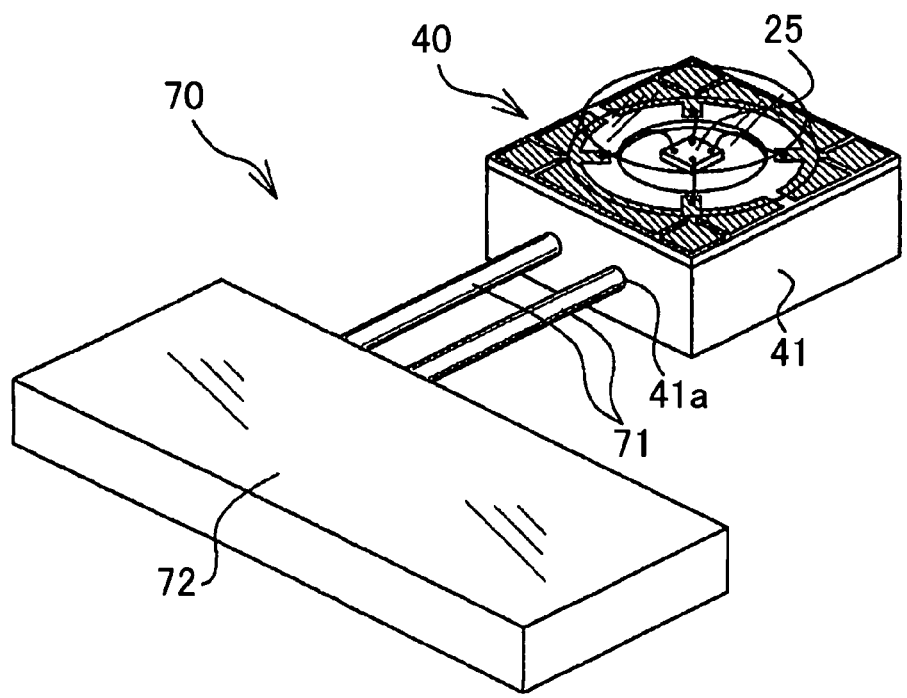
FIG. 8 is a perspective view showing a sixth embodiment of the present invention.

FIG. 8 is a perspective view showing a sixth embodiment of the present invention. The same parts as the third embodiment shown in FIG. 4 are identified with the same reference numerals. An LED device 70 comprises the high luminance LED 40 of the third embodiment, a pair of heat pipes 71 as a thermal conductive member and a heat radiation plate 72 made of material having thermal conductivity. In the heat pipe 71, a liquid having thermal conductivity is charged.

An end of each heat pipe 71 is inserted in the heat radiation hole 41a of the base 41, and the other end of the heat pipe 71 is secured to the heat radiation plate 72 so that the base 41 is thermally connected to the heat radiation plate 72.

When the driving voltage is applied to the LED element 25, the LED element 25 is driven to emit light. The light is discharged as discharge light. Heat discharged from the LED element is effectively transmitted to the base 41 and to the heat radiation plate 72 passing through the heat pipes 71.

In accordance with the sixth embodiment, the LED element 25 is mounted on the base 41 having thermal conductivity to be thermally connected, the base 41 is thermally connected to heat pipes 71, the heat pipes are thermally connected to the heat radiation plate 72. The heat radiation plate 72 effectively radiates the transmitted heat to the atmosphere. Thus, the heat rise in the LED element is held to a minimum limit. Consequently, it is possible to provide an LED device withstanding large current driving to emit high luminance light.

Since the light emitting element 40 and the heat radiation plate 72 can be separated from each other by the heat pipes 71, it is possible to provide an LED device which is easily assembled in a system.

As the fifth embodiment, a print substrate (not shown) is not necessary to have heat radiation role, and hence it is not necessary to make the substrate with expensive material having high thermal conductivity such as metal core.

In order to increase the heat radiation effect of the heat radiation plate 72, it is preferable to change the shape of the plate, and the number of the heat pipes 71 may be increased. The base 41 and the heat pipes 71 may be connected by adhesives having thermal conductivity.

Figure 9:
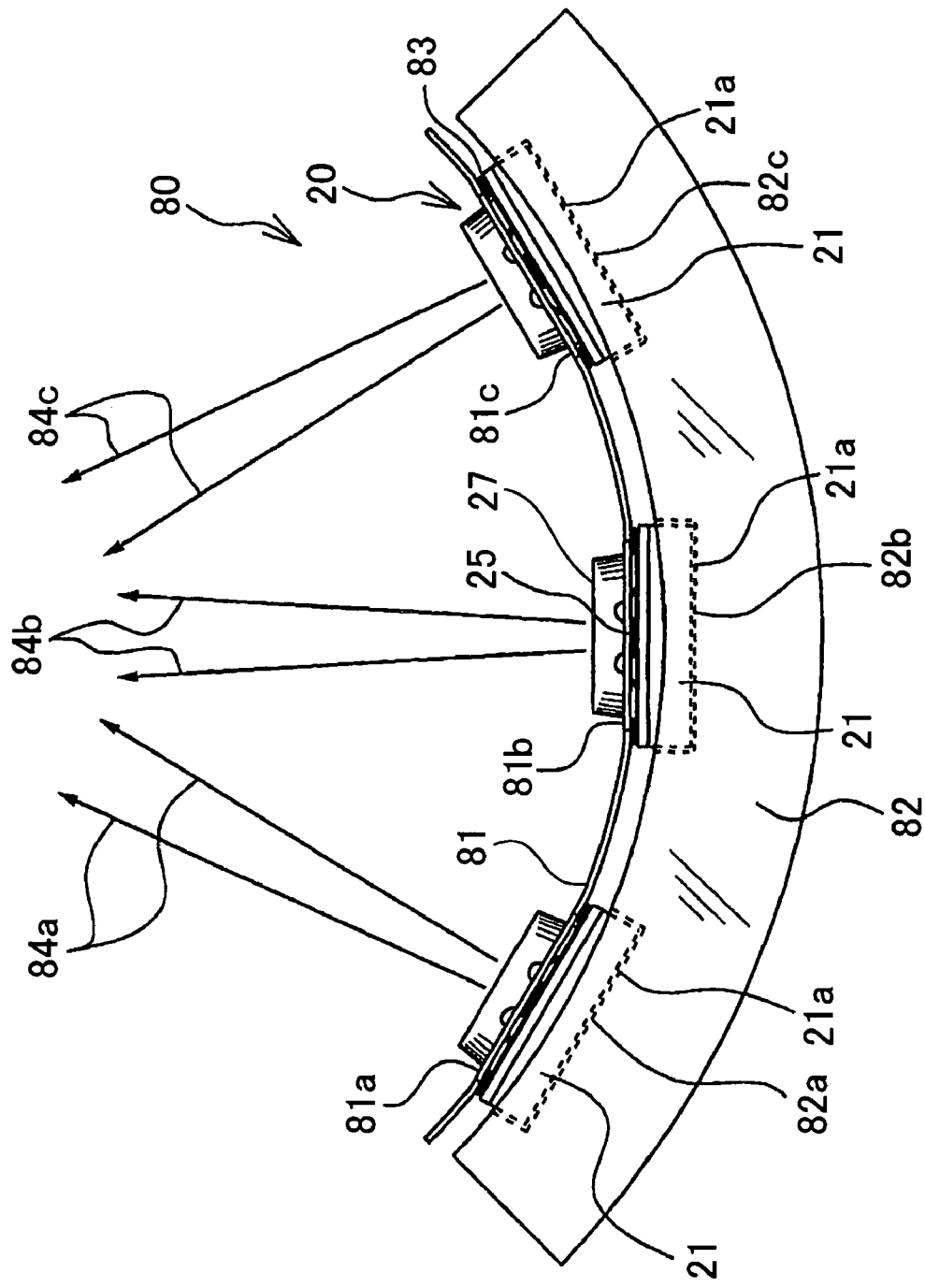
FIG. 9 is a side view showing a seventh embodiment of the present invention.

FIG. 9 is a side view showing a seventh embodiment of the present invention. The same parts as the first embodiment are identified with the same reference numerals. An LED 80 comprises a plurality of high luminance LEDs 20 of the first embodiment, a flexible print substrate 81 and an arcuated heat radiating member 82.

The flexible print substrate 81 has three perforated holes 81a, 81b and 81c in which encapsulating members 27 of the LEDs 20 are inserted. Conductive patterns on the print substrate 81 are connected to terminal portions of the LEDs 20 by solders 83. The heat radiation member 82 has three recesses 82a, 82b and 82c, in each of which the base 21 of the LEDs 20 is inserted and secured thereto to be thermally connected thereto.

When driving current is supplied to the high luminance LEDs 20 through the print substrate 81, the LED elements 25 emit lights 84a, 84b and 84c. Heats discharged from the LED elements 25 are transmitted to the heat radiation member 82 through the bases 21 to be radiated.

In accordance with the seventh embodiment, the bases 21 of the LED elements 25 are mounted on the heat radiation member 82 to be thermally connected. The heat radiation member 82 effectively radiates the transmitted heat to the atmosphere. Thus, the heat rise in the LED element is held to a minimum limit. Consequently, it is possible to provide an LED device withstanding large current driving to emit high luminance light.

As the fifth embodiment, a print substrate 81 is not necessary to have heat radiation role, and hence it is not necessary to make the substrate with expensive material having high thermal conductivity such as metal core.

In the LED device 80, a plurality of high luminance LEDs 20 are provided. Therefore, for example, when high luminance LED elements of red, yellow and green are disposed, it is possible to provide an LED device for emitting lights of various colors.

Since high luminance LEDs 20 are mounted on the flexible heat radiation member 82, discharge lights can be concentrated as shown in FIG. 9, or diffused by bending the heat radiation member 82 into a convex shape.

Hereinafter, a method for manufacturing a plurality of high luminance LEDs at the same time will be described with reference to FIGS. 10–15.

Figure 10:
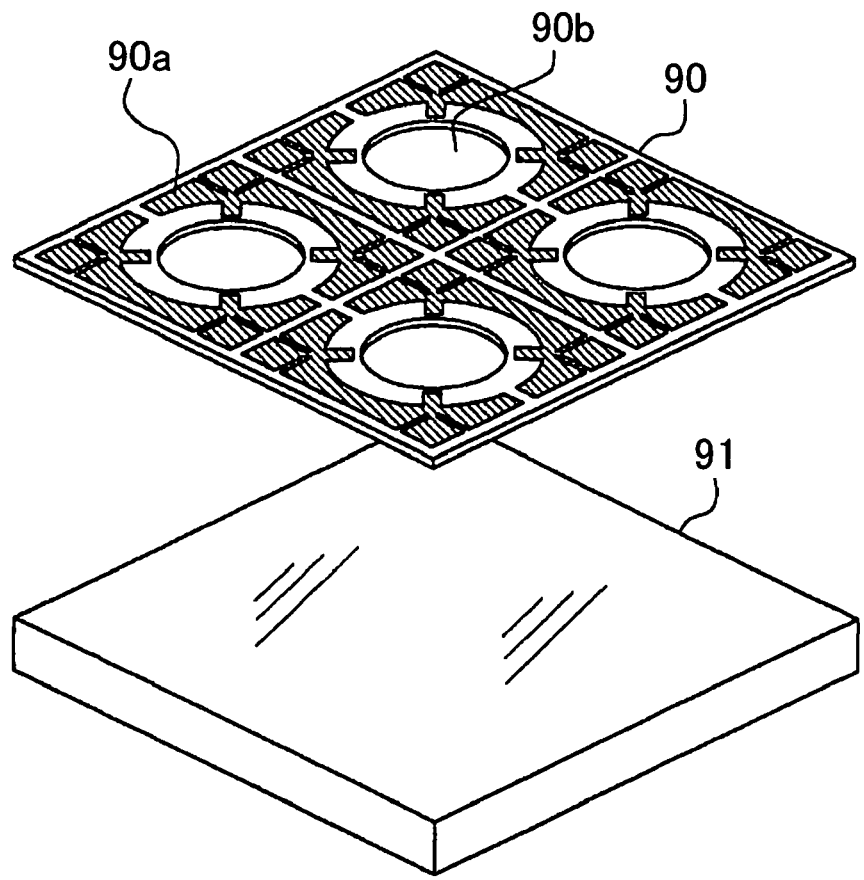
FIG. 10 is a perspective view showing a wire plate aggregation and a base aggregation.

FIG. 10 is a perspective view showing a wire plate aggregation 90 and a base aggregation 91. The wire plate aggregation 90 is made of an insulating material and has four divisions. In each division, a conductive pattern 91a is formed by etching of copper and a mounting hole 90b is formed. The base aggregation 91 is made of a metal core having thermal conductivity.

Figure 11:
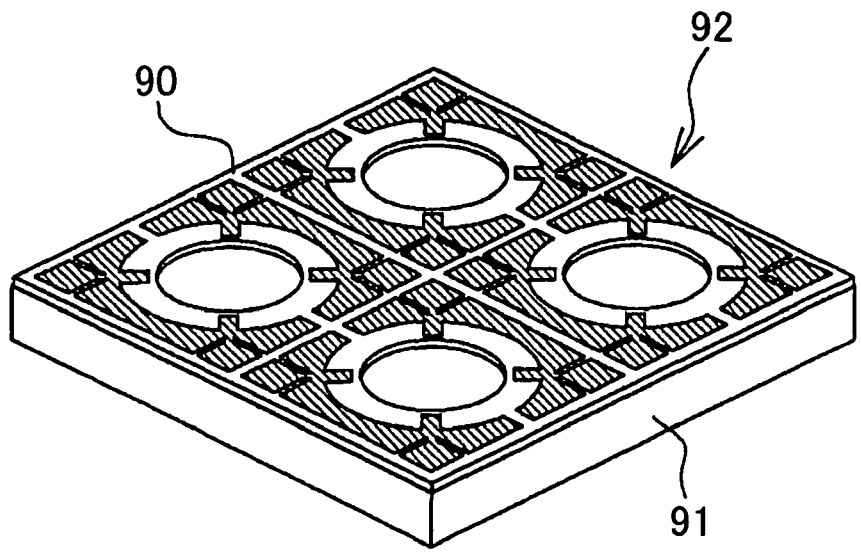
FIG. 11 is a perspective view showing a combination step of the wire plate aggregation and the base aggregation.

FIG. 11 is a perspective view showing a combination step of the wire plate aggregation 90 and the base aggregation 91. The wire plate aggregation 90 is secured to the surface of the base aggregation 91 by an adhesive to form a wire-plate-combined base aggregation 92.

Figure 12:
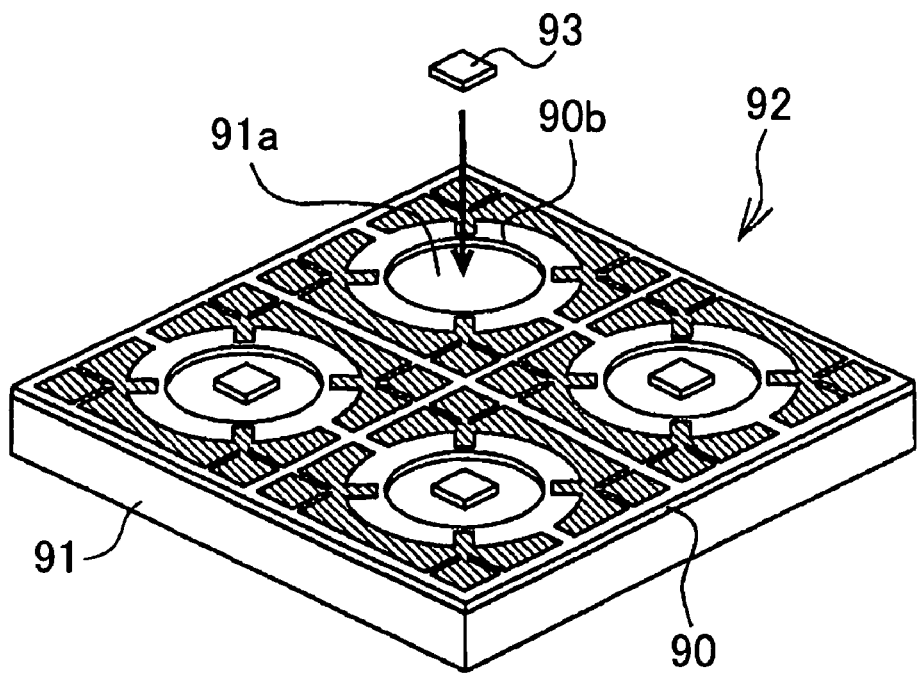
FIG. 12 is a perspective view showing a mounting step of an LED.

FIG. 12 is a perspective view showing a mounting step of an LED element. An LED element 93 is mounted on the wire-plate-combined base aggregation 92 at an exposed portion in the mounting hole 90b and secured thereto by a silver paste.

Figure 13:
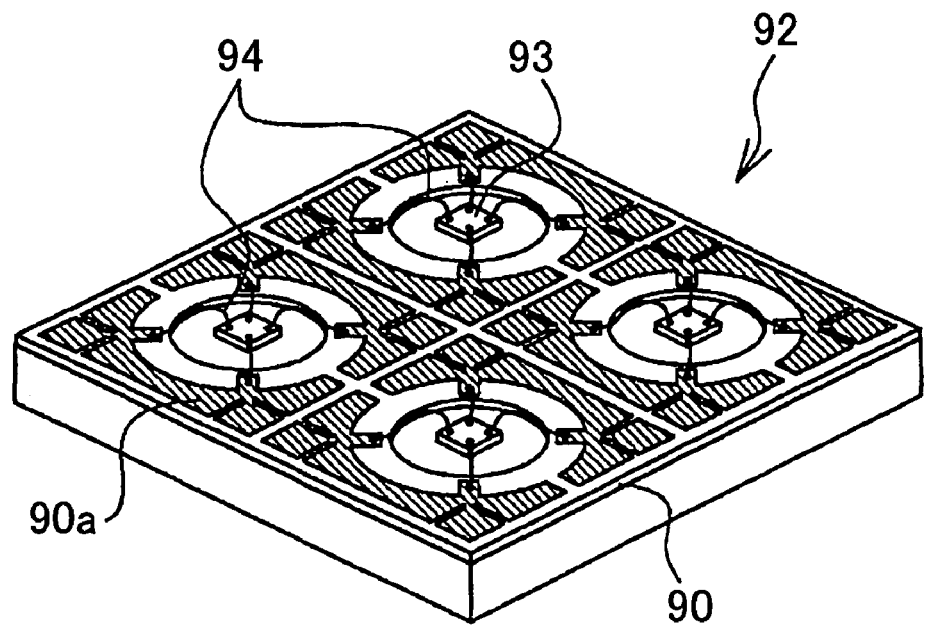
FIG. 13 is a perspective view showing a wire bonding step.

FIG. 13 is a perspective view showing a wire bonding step. The electrodes of the LED element 93 are connected to the conductive patterns 90a by four wires 94.

Figure 14:
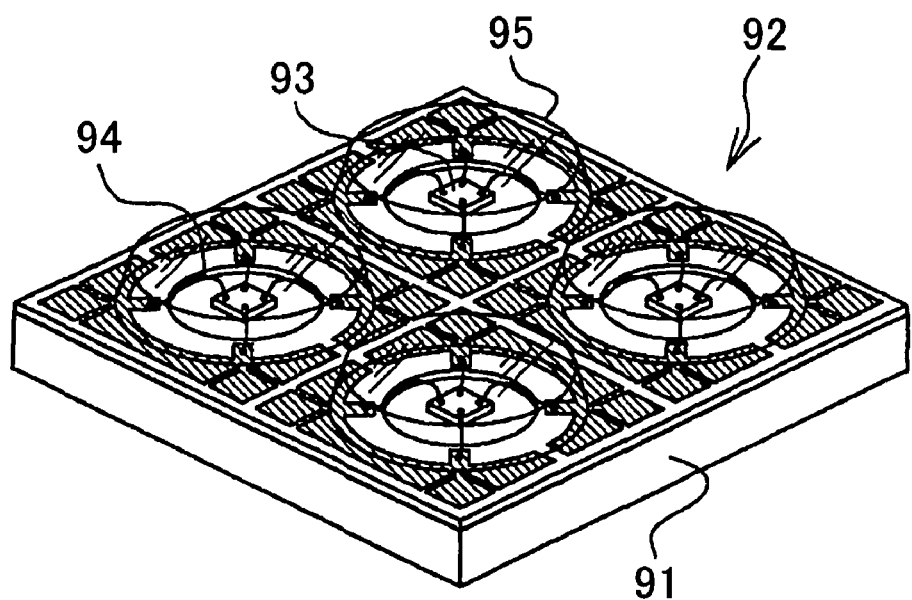
FIG. 14 is a perspective view showing an encapsulating step.
Figure 15:
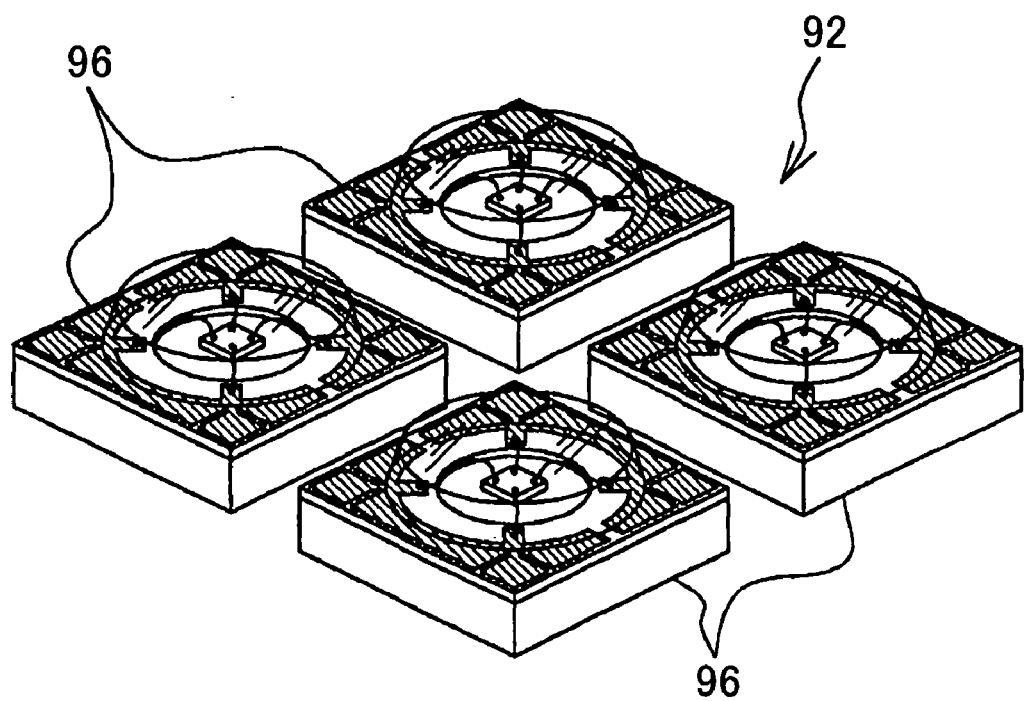
FIG. 15 is a perspective view showing a dicing step.

FIG. 14 is a perspective view showing an encapsulating step. The LED element 93 in each division and wires 94 are encapsulated by an encapsulating member 95 of a transparent resin. Thus, each of the LEDs is completed on the wire-plate-combined base aggregation 92.

Figure 16:
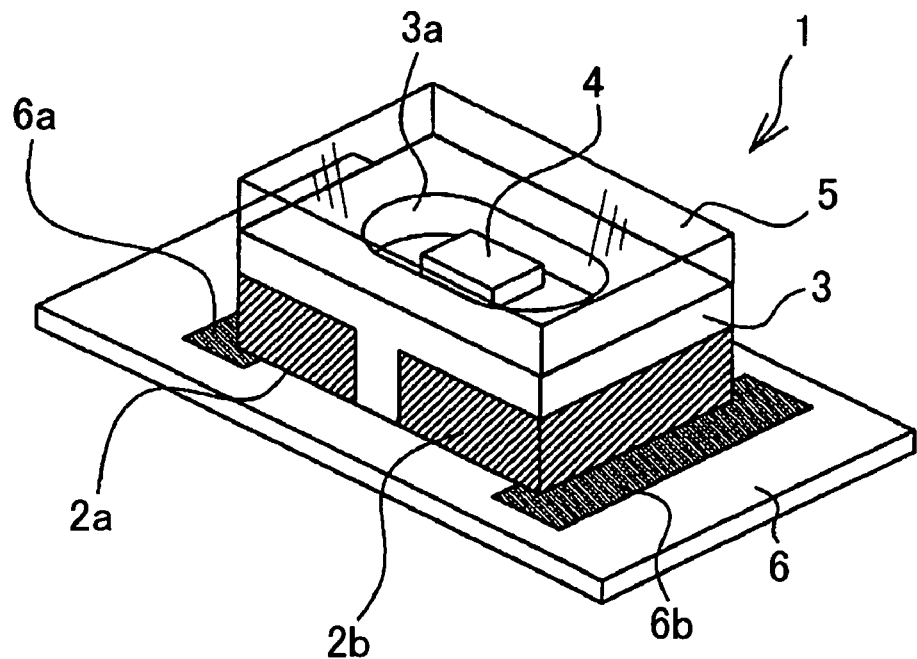
FIG. 16 is a perspective view showing a conventional LED.
Figure 17:
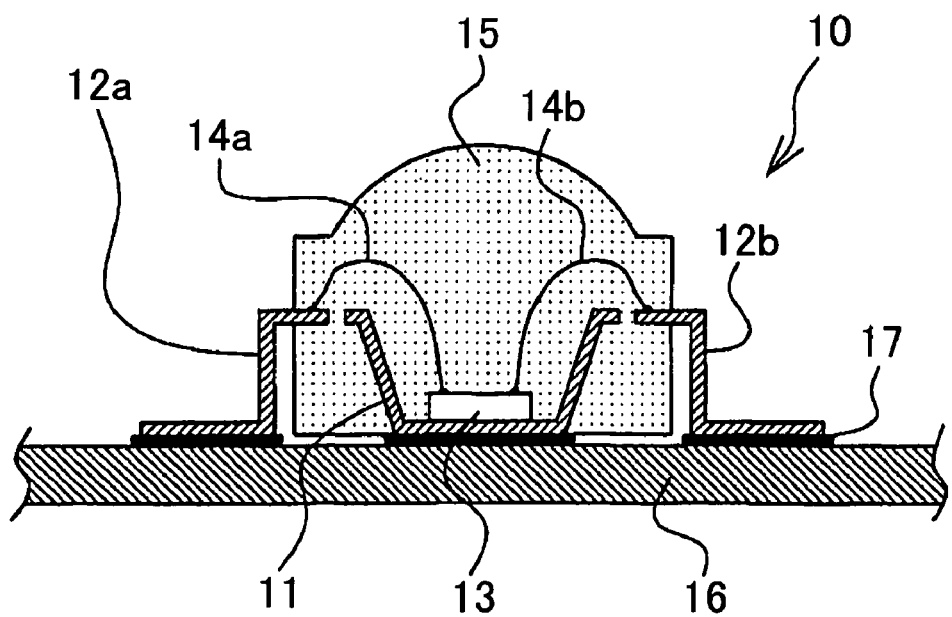
FIG. 17 is a sectional view showing a conventional LED.

The wire-plate-combined base aggregation 92 is diced at boundaries between divisions as shown in FIG. 16 so that a single LED 96 is completed.

Thus, in accordance with the present invention, a large number of LEDs can be manufactured at the same time at a low cost.

If light scattering agents, fluorescent substances or beam attenuating agents are included in the encapsulating member 27, various high luminance LEDs and devices which are different in directivity and wavelength of the discharge light can be provided.

In accordance with the present invention, the LED element is mounted on the base having high thermal conductivity. Therefore, the heat generated in the LED element is effectively conducted to the base, so that a high luminance LED having excellent heat radiation effects can be provided.

While the invention has been described in conjunction with preferred specific embodiment thereof, it will be understood that this description is intended to illustrate and not limit the scope of the invention, which is defined by the following claims.

What is claimed is:

1. A light emitting diode comprising:
   a base made of heat conductive material and having a quadrangular shape;
   a wire plate made of an insulation material and secured to an upper surface of the base;
   exposing means for forming an exposed mounting area on the surface of the base;
   conductive patterns having anode and cathode patterns formed on the wire plate;
   a light emitting diode element having an anode and a cathode on an upper surface thereof and secured to the base at the exposed mounting area; and
   four lead wires for electrically connecting the light emitting diode element to the conductive patterns;
   wherein the wire plate has a same peripheral shape as the base, and
   the four lead wires connect respectively two parts of the anode and two parts of the cathode of the light emitting diode element to the conductive patterns further comprising four terminal portions formed at respective corners on the wire plate.

2. The light emitting diode according to claim 1 wherein the base has a heat radiation surface provided on an underside of the base.

3. The light emitting diode according to claim 1 wherein the exposing means is a perforated hole formed in the wire plate.

4. The light emitting diode according to claim 1 further comprising an encapsulating member for protecting the light emitting diode element.

5. The light emitting diode according to claim 2 further comprising heat radiation holes formed in one of the sides of the base.

6. The light emitting diode according to claim 1, further comprising
   a print substrate having conductive patterns provided on an underside thereof and secured to the conductive patterns on the wire plate so as to electrically connect both the conductive patterns;
   wherein the print substrate has a hole for discharging the light emitted from the light emitting diode element.

7. The light emitting diode according to claim 6 further comprising a heat radiating member secured to an underside of the base.

8. The light emitting diode according to claim 1 further comprising
   heat pipes projected from a side wall of the base; and
   a heat radiation member secured to ends of the heat pipes.

* * * * *